(12) United States Patent
Matsumoto et al.

(10) Patent No.: US 6,252,424 B1
(45) Date of Patent: Jun. 26, 2001

(54) SEMICONDUCTOR INTEGRATED CIRCUIT HAVING I²CBUS INTERFACE

(75) Inventors: Yasunobu Matsumoto; Haruyoshi Fujii, both of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/335,571

(22) Filed: Jun. 18, 1999

(30) Foreign Application Priority Data

Jun. 19, 1998 (JP) .................................................. 10-173336

(51) Int. Cl.[7] .............................. H03K 19/20; G06F 1/24
(52) U.S. Cl. .................................. 326/86; 326/62; 326/82; 326/46; 326/26; 326/118; 327/108; 327/176
(58) Field of Search .................................. 326/62, 46, 82, 326/26, 118, 86; 327/108, 176

(56) References Cited

U.S. PATENT DOCUMENTS

| | | | |
|---|---|---|---|
| 5,717,652 | * | 2/1998 | Ooishi .................................. 365/233 |
| 5,758,098 | * | 5/1998 | Townsley et al. .................... 395/282 |
| 5,761,124 | * | 6/1998 | Sato et al. ........................ 365/185.22 |
| 6,052,313 | * | 4/2000 | Alsunri et al. .................... 365/189.05 |

FOREIGN PATENT DOCUMENTS

402189612A * 7/1990 (JP) .

* cited by examiner

*Primary Examiner*—Viet Q. Nguyen
(74) *Attorney, Agent, or Firm*—Adams & Wilks

(57) ABSTRACT

To prevent a deadlock in a latch circuit for deciding an input state of an SDA terminal in a system initialization state. An input/output control circuit 5 for always determining a data state in the system initialization state is provided.

8 Claims, 2 Drawing Sheets

SEMICONDUCTOR INTEGRATED CIRCUIT HAVING I²CBUS INTERFACE

BACKGROUND OF THE INVENTION

The present invention relates to a semiconductor integrated circuit including an I²CBUS interface.

An I²CBUS interface is constructed of two bus lines including a serial data line (hereinafter referred to as an SDA) and a serial clock line (hereinafter referred to as an SCL), and is a bus standard having the objective of effectively conducting control between ICs mutually.

Since data transmission/reception in both directions is performed by only tow bus lines, in a system initialization state inside the IC such as that immediately after power is supplied to the IC, in the case of the IC having a function as a slave device, it is essential that an SDA terminal is in a data receiving state.

A signal from an I²BUS I/O terminal is input or output by an input/output control circuit used in the I²CBUS interface, and two circuit examples generally used for the input/output control circuit are shown in FIG. 2 and FIG. 3.

In the prior art, as a means of realizing an input/output control circuit for determining the above-described data receiving state, a D type flip/flop circuit having a reset input as shown in FIG. 2 (hereinafter, referred to as a D-F/F circuit) with a reset input signal R from an outer reset terminal 20, or a D-F/F circuit having a reset input as shown in FIG. 3 with a reset input from a POWER•ON•CLEAR circuit (hereinafter, referred to as a POC circuit 21) which outputs one pulse immediately after power is supplied with a set pule width decided by an RC time constant, was used.

The former is controllable in the data receiving state because an externally-supplied reset signal can be input when performing system initialization such as by the supply of power.

The latter determines the data receiving state by using the output signal in the system initialization state such as by the supply of power, because the basic operation principle of the POC circuit is that of voltage detection of the power by the RC time constant.

As an advantage of an I²CBUS interface, a simple circuit structure in which the number of pins is lessened is used. For this reason, to lessen the number of the pins, there are many cases in which a reset input terminal is not provided to a device (an IC or the like) mounted on a product, or if provided, the reset input terminal is not used according to the product specification.

Also, since a POC circuit utilizes an RC time constant, there arise problems in that it takes too much time for starting up upon the application of power, and a reset signal con not be normally generated in the case of voltage fluctuations in which the voltage does not completely fall down to a GND level (for example, an instant power failure, or the like).

Therefore, there has been desired a counter measure, which is an IC built-in circuit, that can detect that if it is in a system initialization state such as a supply of power, even in a state where the start up of power takes an extremely long time and in a state where voltage fluctuations do not completely fall down in voltage to the GND level, and is capable of controlling in the data receiving state.

SUMMARY OF THE INVENTION

In order to solve the above-described problems, numerous proposed solutions will be described. In a primary solution, an apparent difference in driving ability is provided between a P channel transistor and an N channel transistor of a 2 NOR gate D-F/F circuit, a clocked inverter and the like, which constitute a control circuit, and in a system initialization state such as supply of a power (e.g., a power on mode), an adjustment is performed so that an inversion potential of the transistor for deciding an output of an input/output control circuit is determined on a logical value (data receiving state) side which is preliminary assumed. Also, at that time, there is provided a method for adding an off transistor that is constructed of the N channel transistor so that the potential is readily determined on the same logical value side.

Further, there is provided a method in which, in the system initialization state such as supply of the power, the result obtained by detecting a data output state by comparing a reference voltage, which is obtained by appropriately dividing a GND and a power voltage with resistances, and a voltage of a BUS line, is allowed to a feedback to the above-described input/output control circuit, thereby setting to the data receiving state.

DETAILED DESCRIPTION OF THE INVENTION

Figure 1:
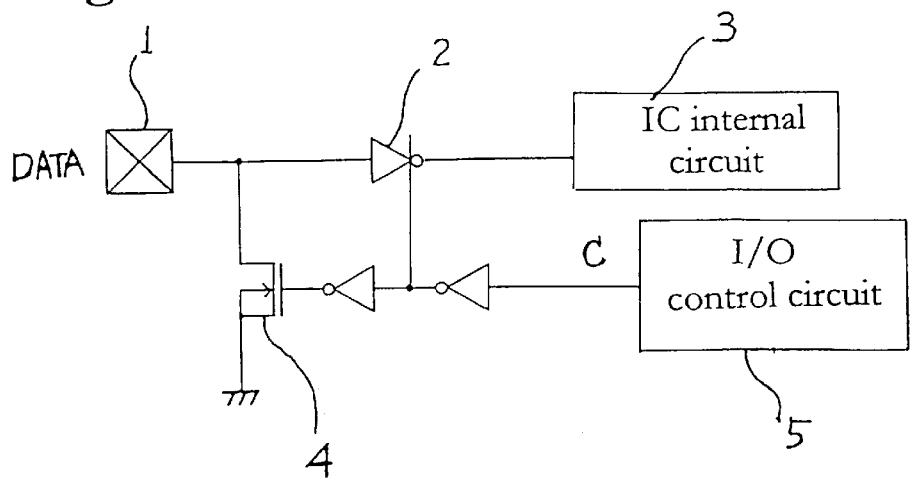
FIG. 1 is a structural example of the present invention.
Figure 2:
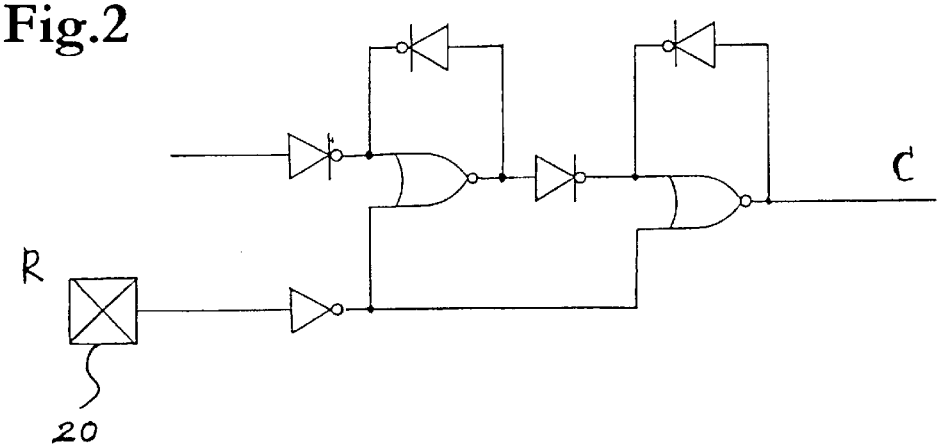
FIG. 2 is a block diagram showing a conventional example.
Figure 3:
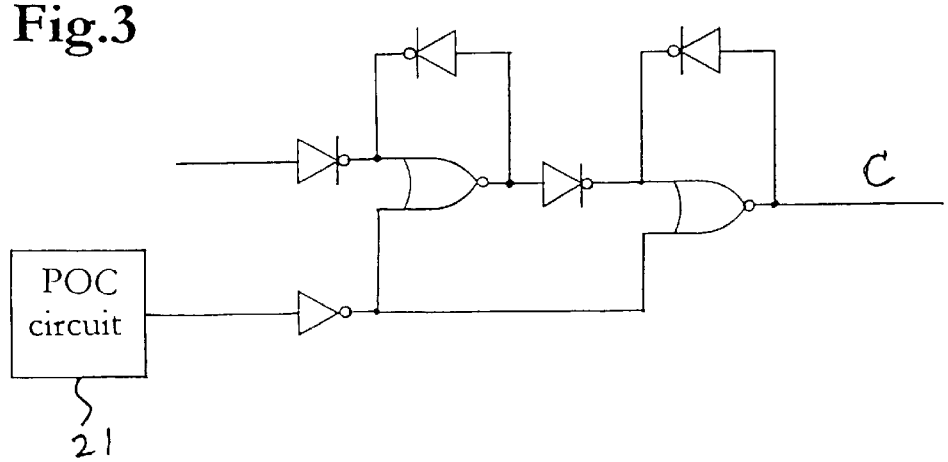
FIG. 3 is a block diagram showing another conventional example.

FIG. 1 is a diagram showing an I²CBUS interface circuit of the present invention. When data DATA is read from an I²BUS I/O terminal 1, an output driver N channel open drain transistor 4 is turned OFF by anoutput signal C of an input/output control circuit 5, and the data DATA is read to an IC inner circuit 3 via a clocked inverter circuit 2.

Subsequently, an operation of the IC inner circuit 3 outputting a signal from the I²BUS I/O terminal 1 will be described. When the output driver N channel open drain transistor 4 is turned ON by the signal C, the I²BUS I/O terminal 1 becomes "L", and when it is OFF, the I²BUS I/O terminal 1 becomes "H", and an "H" or "L" signal is output from the I²BUS I/O terminal 1.

Figure 4:
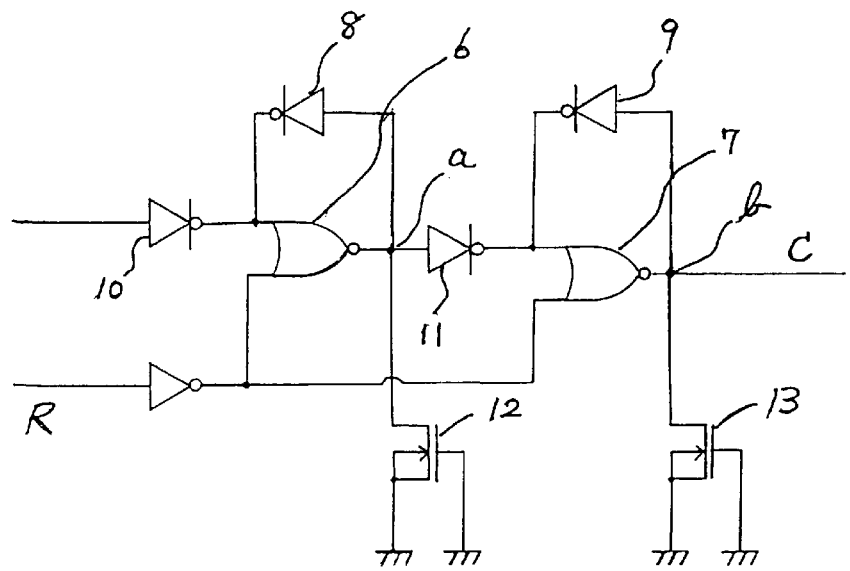
FIG. 4 is a block diagram showing an embodiment of the present invention.
Figure 5:
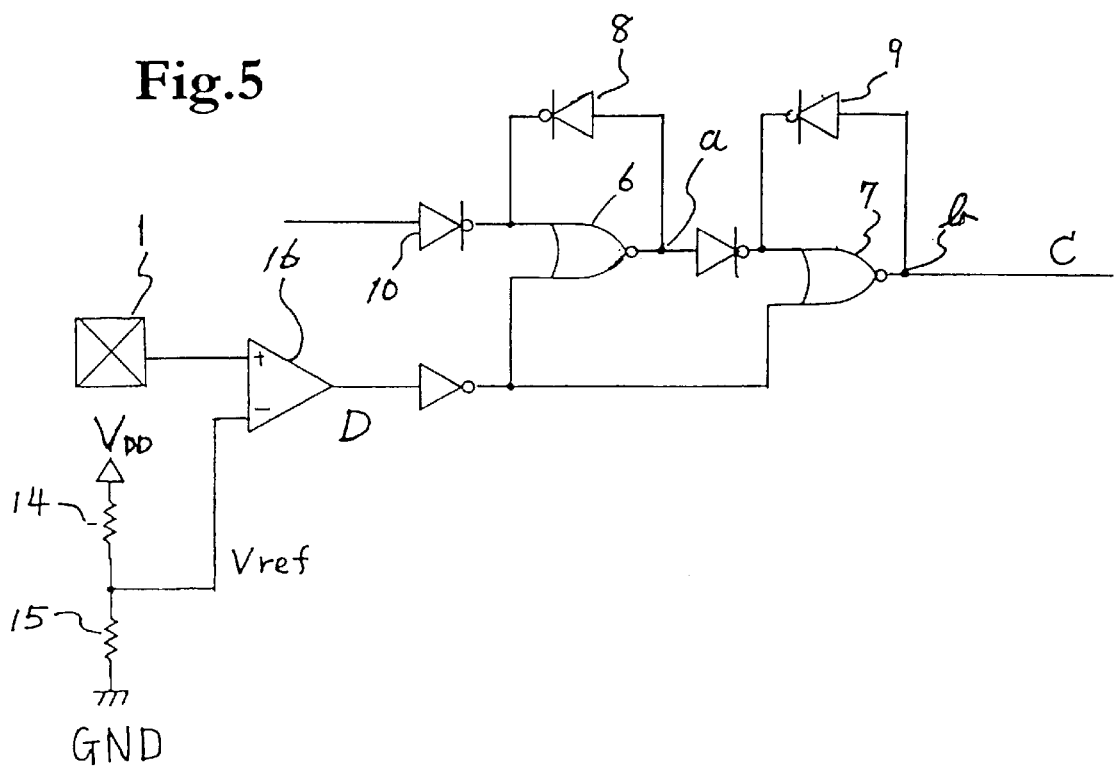
FIG. 5 is a block diagram showing an embodiment of the present invention.

FIG. 4 and FIG. 5 show circuit examples of the input/output control circuit of FIG. 1 constructed of a D-F/F circuit.

In FIG. 4, if the potentials of a node a and node b are secured at in "L" level in the initialization state, a deadlock can be prevented. For this reason, a ratio of a P channel transistor and an N channel transistor of 2 NOR circuits 6 and 7, clocked inverter circuits 8, 9, 10, and 11 which constitute a latch (a ratio in driving ability between the P channel transistor and the N channel transistor) is varied to perform an adjustment so that an inversion potential is readily inverted to an ideal value side.

Further, off transistors 12 and 13 each composed of an N channel transistor so as to readily determine the potential on the ideal value side are added to the node a and the node b. R denotes a reset signal.

In other words, even though the reset signal is not generated at the time of a start up of a power or voltage fluctuations, by taking a counter measure so that the output of the D-F/F circuit for determining the state of the control circuit is determined to the logical value that indicates the data receiving side without fail, the deadlock of the system itself is prevented.

It is to be noted that a deadlock means that in a system constructed of an I²CBUS interface, as a non-accepted operation, a slave side IC cause a bus line to drive and leads to a state in which a signal from a master side is not accepted (hereinafter, referred to as deadlock).

In FIG. 5, a reference voltage Vref that is obtained by appropriately dividing a GND and a power voltage VDD by resistances 14 and 15 is an appropriate potential with which it is capable of comparing as to whether a voltage of a bus line of the I²CBUS is at an "H" level or an "L" level. With this, the result obtained by detecting the data output state by a comparator 16 is allowed to a feedback to the input/output control circuit 5 shown in FIG. 1 as a deadlock detection signal to make the data receiving state.

In other words, the fact that the bus line of the I²CBUS is always connected to the "H" level via a resistance, and each output is connected to the N channel open drain is utilized. That is, in the system initialization state such as supply of the power, if it is possible to detect as to whether the bus line is at the "H" level or the "L" level, it is possible to judge whether it is in the data receiving state or the data output state.

In the final form (a product), even though a reset signal is not generated due to a slow start up of a power or the like, a deadlock state of a system can be prevented. This is effective to an easy handling of the product and an improvement of the reliability. Also, since a reset terminal is dispensed with, the chip size of an IC may be scaled down, and a cost reduction can be expected.

What is claimed is:

1. An interface circuit for an integrated circuit, comprising: an input/output terminal; a switching device connected to the input/output terminal; a control circuit comprising a D-type flip-flop for outputting a signal for controlling the ON/OFF state of the switching device; and a latch circuit connected to the switching device and receptive of the output signal of the control circuit for latching a signal applied to the input/output terminal.

2. An interface circuit according to claim 1; wherein the switching device comprises an open drain output transistor having a drain terminal connected to the input/output terminal and the latch circuit, a gate electrode connected to the control circuit, and a source electrode connected to a reference potential.

3. An interface circuit according to claim 1; wherein the D-type flip-flop comprises a first NOR gate, a first inverter having a first input connected to an output of the first NOR gate, a second NOR gate having a first input connected to an output of the first inverter, a second inverter having an input connected to an output of the first NOR gate and an output connected to the first input of the first NOR gate, and a third inverter having an input connected to an output of the second NOR gate and an output connected to the first input of the second NOR gate.

4. An interface circuit according to claim 3; wherein the drivability of N-channel and P-channel MOS transistors of the first and second NOR gates and the first through third inverters is set such that the D-type flip-flop outputs a desired level upon initialization of the integrated circuit.

5. An interface circuit for an integrated circuit, comprising: an input/output terminal; a switching device having a first terminal connected to the input/output terminal and a second terminal connected to ground to function as an output driver; a control circuit comprising a D-type flip-flop for outputting a signal for controlling the ON/OFF state of the switching device; and a latch circuit connected to the switching device and receptive of the output signal of the control circuit for latching a signal applied to the input/output terminal; wherein the control circuit outputs a control signal to the switching device when power is applied thereto.

6. An interface circuit according to claim 5; wherein the switching device comprises an open drain output transistor having a drain terminal connected to the input/output terminal and the latch circuit, a gate electrode connected to the control circuit, and a source electrode connected to a reference potential.

7. An interface circuit according to claim 5; wherein the D-type flip-flop comprises a first NOR gate, a first inverter having a first input connected to an output of the first NOR gate, a second NOR gate having a first input connected to an output of the first inverter, a second inverter having an input connected to an output of the first NOR gate and an output connected to the first input of the first NOR gate, and a third inverter having an input connected to an output of the second NOR gate and an output connected to the first input of the second NOR gate.

8. An interface circuit according to claim 5; wherein the drivability of N-channel and P-channel MOS transistors of the first and second NOR gates and the first through third inverters is set such that the D-type flip-flop outputs a desired level upon initialization of the integrated circuit.

* * * * *